(12) United States Patent
Leu et al.

(10) Patent No.: US 8,312,401 B2
(45) Date of Patent: Nov. 13, 2012

(54) METHOD FOR SMART DEFECT SCREEN AND SAMPLE

(75) Inventors: Iyun Leu, Hsinchu (TW); Chin Hsen Lin, Fremont, CA (US)

(73) Assignee: Elitetech Technology Co., Ltd., Zhudong Town (TW)

( * ) Notice: Subject to any disclaimer, the term of this patent is extended or adjusted under 35 U.S.C. 154(b) by 2 days.

(21) Appl. No.: 13/005,932

(22) Filed: Jan. 13, 2011

(65) Prior Publication Data

US 2012/0185818 A1 Jul. 19, 2012

(51) Int. Cl.
G06F 17/50 (2006.01)

(52) U.S. Cl. ....................................................... 716/112

(58) Field of Classification Search ................... 716/100, 716/112
See application file for complete search history.

(56) References Cited

U.S. PATENT DOCUMENTS

| | | | |
|---|---|---|---|
| 6,433,561 B1 * | 8/2002 | Satya et al. | 356/237.5 |
| 7,355,693 B2 * | 4/2008 | Takeda et al. | 356/237.5 |
| 7,599,054 B2 * | 10/2009 | Takeda et al. | 356/237.5 |
| 2006/0236294 A1 * | 10/2006 | Saidin et al. | 716/19 |
| 2008/0162065 A1 * | 7/2008 | Takeda et al. | 702/82 |
| 2009/0297019 A1 * | 12/2009 | Zafar et al. | 382/145 |
| 2010/0100356 A1 * | 4/2010 | Tsutsui | 702/184 |
| 2010/0119144 A1 * | 5/2010 | Kulkarni et al. | 382/149 |
| 2011/0286656 A1 * | 11/2011 | Kulkarni et al. | 382/144 |

* cited by examiner

*Primary Examiner* — Suchin Parihar
(74) *Attorney, Agent, or Firm* — C. G. Mersereau; Nikolai & Mersereau, P.A.

(57) ABSTRACT

A method for smart defect review is disclosed. The method includes pre-processing a design layout into a plurality of layout based pattern groups, dividing the design layout into a plurality of cells, overlapping the cells belong to the same layout based pattern groups, extracting a plurality of defect data of all defects on a wafer, constructing a plurality of layout based defect composite pattern groups, executing layout pattern match to obtain each individual layout based defect composite pattern group, performing some defect sample selection rules to each layout based defect composite pattern group, sorting the layout based defect composite pattern groups into different defect types, obtaining a defect image file by reviewing different sample number of defect image from each layout based defect composite pattern group, and generating a defect pattern library or a defect yield prediction by performing a defect yield diagnosis to the defect image file.

11 Claims, 6 Drawing Sheets

METHOD FOR SMART DEFECT SCREEN AND SAMPLE

BACKGROUND OF THE INVENTION

1. Field of the Invention

The present invention relates to a method for defect diagnosis, and particularly to a method for defect screen and sample.

2. Description of Prior Art

The fabrication process for integrated circuit dice includes film deposition, masking, photo lithography, etching, etc. During the fabrication process, the random particle defect and systematic defect are affecting the product yield. The product yield is related to the die cost.

As the feature size of the design layout shrinks, the product yield relevant defects become smaller. Fab has to increase the sensitivity of a scan and inspection tool in order to capture all killer defects on the wafer. As a result, the number of detected defects may increase and the percentage of non-killer defects may be higher. Further, when a scanning electron microscope (SEM) review tool is used to observe and classify all killer defects in order to determine a potential clue, a limited time in the fab and Review SEM capacity may restrict review sampling count per wafer. Consequently, it may be difficult to identify a defect of interest type that should be monitored in production and have increased risk of missing the killer defects.

Without a quick and innovative method to identify systematic defect early, fab may suffer larger yield loss and take longer learning curve cycle time toward volume production.

SUMMARY OF THE INVENTION

The invention provides a method for smart defect screen and sample to improve the systematic defect capture rate and defect review efficiency.

An embodiment of the method for smart defect review according to the present invention includes pre-processing a design layout of a product into many layout based pattern groups before any defect scan process, wherein the design layout has a plurality of layout patterns, dividing the design layout into a plurality of cells, wherein each cell belongs to a layout based pattern group according to the layout pattern's feature; overlapping the cells with the same layout based pattern groups; extracting a plurality of defect data of defects on a wafer from a defect scan and inspection tool, wherein each defect data comprises a defect size and a corresponding defect coordinate; constructing a plurality of layout based defect composite pattern groups by mapping the defects onto the overlapped layout based pattern groups; executing layout pattern match to obtain each individual layout based defect composite pattern group if original layout based defect composite pattern group contains more than one defect cluster layout patterns; performing some defect sample selection rules to each layout based defect composite pattern group for judging a potential systematic defect priority; sorting the layout based defect composite pattern groups into different defect types according to the potential systematic defect priority; obtaining a defect image file by reviewing different sample number of defect image from each layout based defect composite pattern group according to the defect types; and generating a defect pattern library or a defect yield prediction by performing a defect yield diagnosis to the defect image file.

Therefore, the method for smart defect screen and sample is capable of improving the systematic defect capture rate and reviewing efficiency under lower sampling-rate.

For further understanding of the present invention, reference is made to the following detailed description illustrating the embodiments and examples of the present invention. The description is for illustrative purpose only and is not intended to limit the scope of the claim.

DETAILED DESCRIPTION OF THE INVENTION

The invention discloses a method for smart defect screen and sample by reviewing different sample number of defect image from each layout based defect composite pattern group according to the defect types. If there is any systematic defect happened on the product during fabrication process, a user (engineer or designer) could know earlier and manage it accurately.

The product may be a wafer, a mask, a PC board, a flat panel display, a wafer bump, LED, or solar cell.

The method for smart defect screen and sample may be performed by software or in combination with software and hardware via a single computer or multiple computers interact with one another.

Figure 1A:
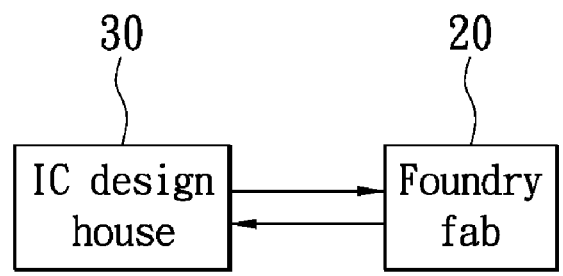
FIG. 1A is a block diagram of a design house and a foundry fab in accordance with an embodiment of the present invention.

FIG. 1A shows a block diagram of a design house and a foundry fab in accordance with an embodiment of the present invention. This embodiment takes the wafer as the example of the product.

In overall, the method for smart defect screen and sample is mainly performed in a foundry fab 20 (hereinafter referred as to fab 20) or IC design house 30 (hereinafter referred as to design house 30). The design house 30 provides a design layout of its IC design to the fab 20. The fab 20 utilizes hundreds of equipment to fabricate a lot of duplicated dice according to the design layout on the wafer 10. During the fabrication, some defects such as random particle defects, process defects, or systematic defects may be inevitably generated on the wafer 10.

The defects are detected by a defect scan and inspection tool at the fab 20, then the defect scan and inspection tool produces a plurality of defect data corresponding to the defects. A computer at the fab 20 is triggered to analyze the defect data by operating the method for smart defect screen and sample and generates a defect pattern library or a defect yield prediction using the method of defect yield diagnosis to the design house 30.

Figure 1B:
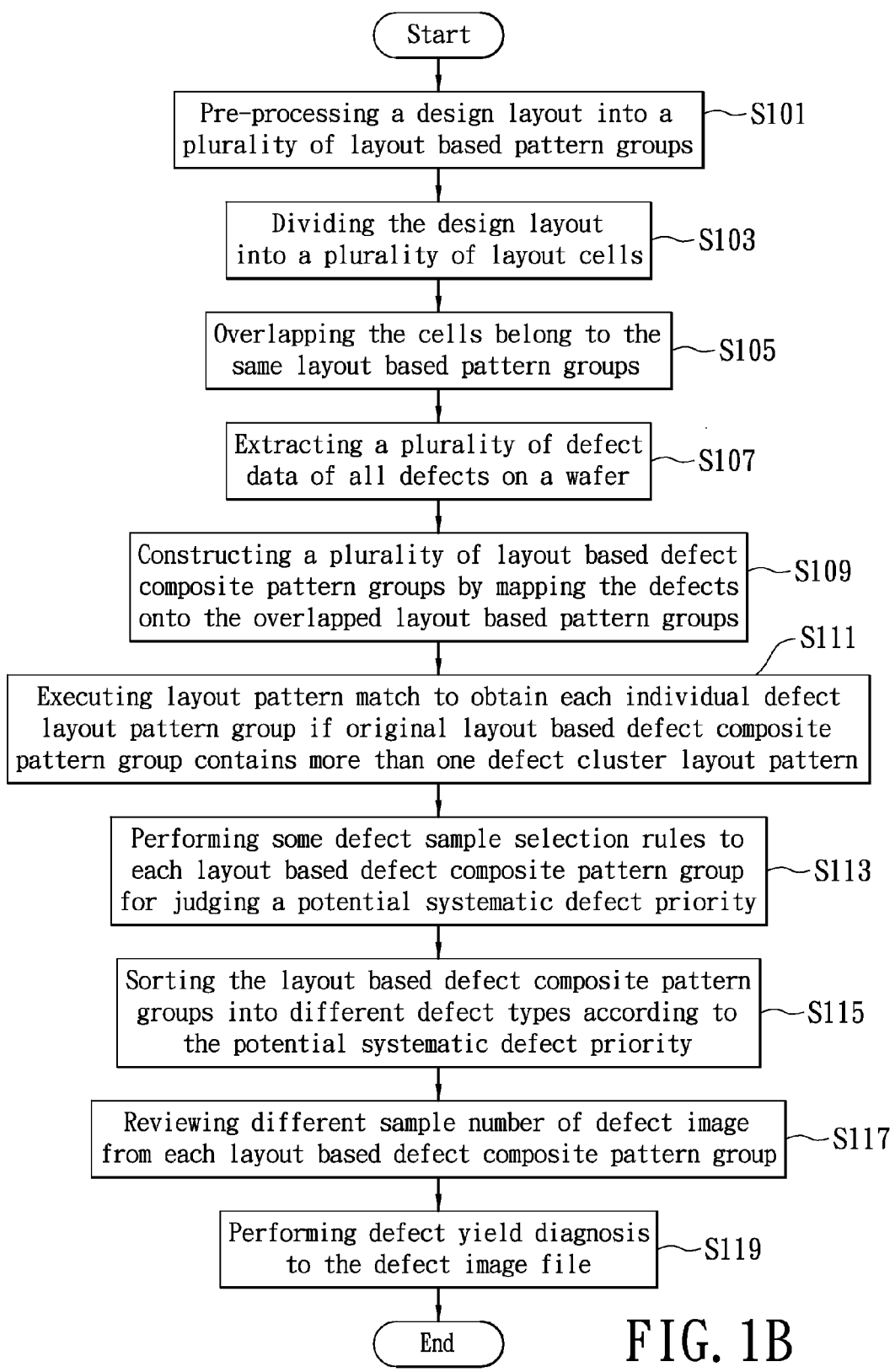
FIG. 1B is a flowchart of the method for smart defect screen and sample in accordance with a first embodiment of the present invention.

FIG. 1B shows a flowchart of the method for smart defect screen and sample in accordance with a first embodiment of the present invention.

Figure 1C:
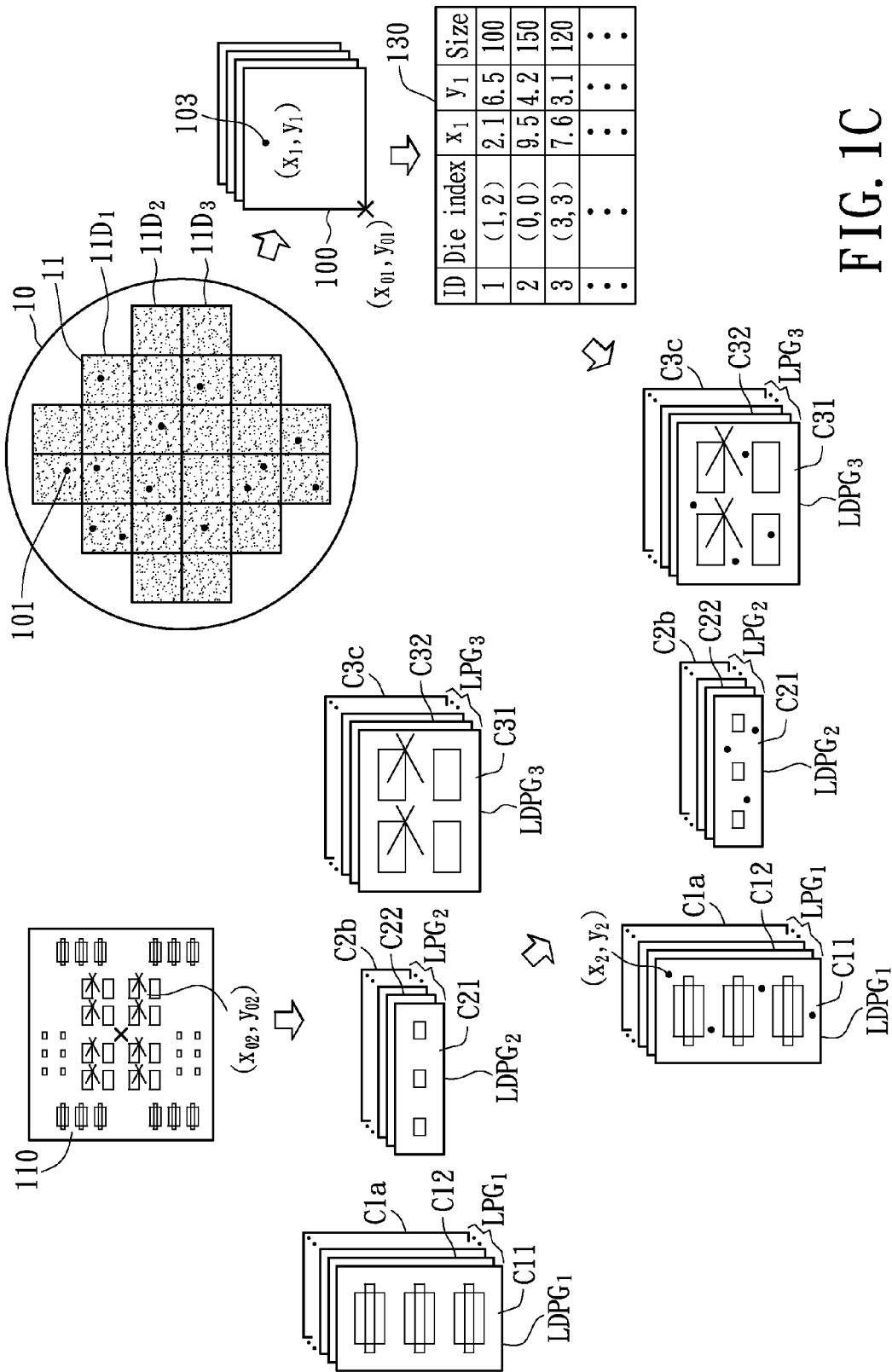
FIG. 1C is a schematic view of the method for smart defect screen and sample in accordance with the first embodiment of the present invention.

Please refer to FIG. 1B and associated with FIG. 1C. The FIG. 1C illustrates a schematic view of the method for smart defect screen and sample in accordance with the first embodiment of the present invention.

The user pre-process a design layout 110 into a plurality of layout based pattern groups (S101). The design layout 110 is designed for the wafer 10 by the user. The wafer 10 has a full-chip layout 11 on it and the full-chip layout 11 includes a plurality of dice $11D_1$, $11D_2$, and $11D_3$. The computer extracts a design layout 110 of each die $11D_1$, $11D_2$, or $11D_3$, in the full-chip layout 11 from a design layout database (not shown). The design layout 110 has a plurality of layout patterns and a second reference point $(x_{O2}, y_{O2})$ at the center of the design layout 110 or the wafer 110. The layout patterns have different layout pattern features.

The computer divides the design layout 110 into a plurality of cells C11~C1a, C21~C2b, C31~C3c, etc according to the contour feature of each one of layout patterns (S103). Some of cells C11~C1a, C21~C2b, C31~C3c, etc have the same contour feature belong to the same layout based pattern group $LPG_1$, $LPG_2$, or $LPG_3$, etc. Each one of the layout based pattern groups $LPG_1$, $LPG_2$, or $LPG_3$ has different amount of the cells C11~C1a, C21~C2b, C31~C3c, etc.

Then the computer overlaps the cells C11~C1a, C21~C2b, C31~C3c, etc belong to the same layout based pattern group $LPG_1$, $LPG_2$, or $LPG_3$, etc (S105).

The computer extracts a plurality of defect data 130 of all defects 101 on the wafer 10 from a defect scan and inspection tool (not shown) (S107). The FIG. 1C illustrates one defect 101 on a defect layout pattern 100 obtained from the defect scan and inspection tool. The defect data 130 of the defect 103 includes an identification number, a die index, a first defect coordinate $(x_1, y_1)$ and a size of the defect 101. The first defect coordinate $(x_1, y_1)$ is related to a first reference point $(x_{O1}, y_{O1})$ produced from the defect scan and inspection tool. The first reference point $(x_{O1}, y_{O1})$ may be at the center or the corner of the defect layout pattern 100 as a marker.

The defect data further includes product name, defect process stage, lot number and rough defect image, etc. It is worthy to notice that the first defect coordinate $(x_1, y_1)$ on the wafer 10 is not the accurate coordinate of the defect on the design layout 110.

In one implementation, the file format of the defect layout pattern 100 may be JPG, PNG, TIFF, or text format, and the file format of the design layout 110 may be GDS or OASIS format.

The computer performing a coordinate conversion to the first defect coordinates with the first reference point $(x_{O1}, y_{O1})$ to a design layout coordinate system with the second reference point $(x_{O2}, y_{O2})$. As a result, the first defect coordinate $(x_1, y_1)$ is converted to a second defect coordinate $(x_2, y_2)$ related to the second reference point $(x_{O2}, y_{O2})$. The second reference point $(x_{O2}, y_{O2})$ may be a center point or origin (0, 0) point of the design layout 110.

The computer constructs a plurality of layout based defect composite pattern groups $LDPG_1$, $LDPG_2$, and $LDPG_3$, etc by mapping the defects 101 onto the overlapped layout based pattern groups $LPG_1$, $LPG_2$, and $LPG_3$, etc (S109).

Each layout based defect composite pattern group $LDPG_1$, $LDPG_2$, or $LDPG_3$ has different layout pattern and different composited defect pattern. The computer executes a layout pattern match to obtain each individual defect layout pattern group if original layout based defect composited pattern group contains more than one defect cluster layout pattern (S111). The computer performs some defect sample selection rules to each layout based defect composite pattern group $LDPG_1$, $LDPG_2$, or $LDPG_3$ for judging a potential systematic defect priority (S113).

The computer sorts the layout based defect composite pattern groups $LDPG_1$, $LDPG_2$, and $LDPG_3$ into different defect types according to the potential systematic defect priority (S115).

The defect types comprise systematic defect type and non-systematic defect type. The systematic defect type may be a necking defect, a bridging defect, a missing defect, a collapsing defect, or a design weak layout defect. The non-systematic defect type may be a dummy pattern defect, an abnormal process defect, a mask defect, a random particle defect, or a nuisance defect.

Some of the defect layout patterns 100 of each layout based defect composite pattern group $LDPG_1$, $LDPG_2$, or $LDPG_3$, etc are sent for further SEM review with different sampling number according to the potential systematic defect priority. Therefore, the method for smart defect screen and sample could monitor the defects accurately and save much time for SEM review without missing any systematic defects.

Then, the computer obtains a defect image file by reviewing different sample number of defect image from each layout based defect composite pattern group $LDPG_1$, $LDPG_2$, or $LDPG_3$, etc according to the defect types (S117).

Finally, the computer generates a defect pattern library or a defect yield prediction by performing a defect yield diagnosis to the defect image file (S119). The reviewed defect image may be stored in defect pattern library as binary code or polygon drawing. The binary code may be in GDS or OASIS format, and the polygon drawing may be in JPG, PNG, TIFF, or text format. The defect pattern library may be saved in the web site of the fab 20.

Figure 2:
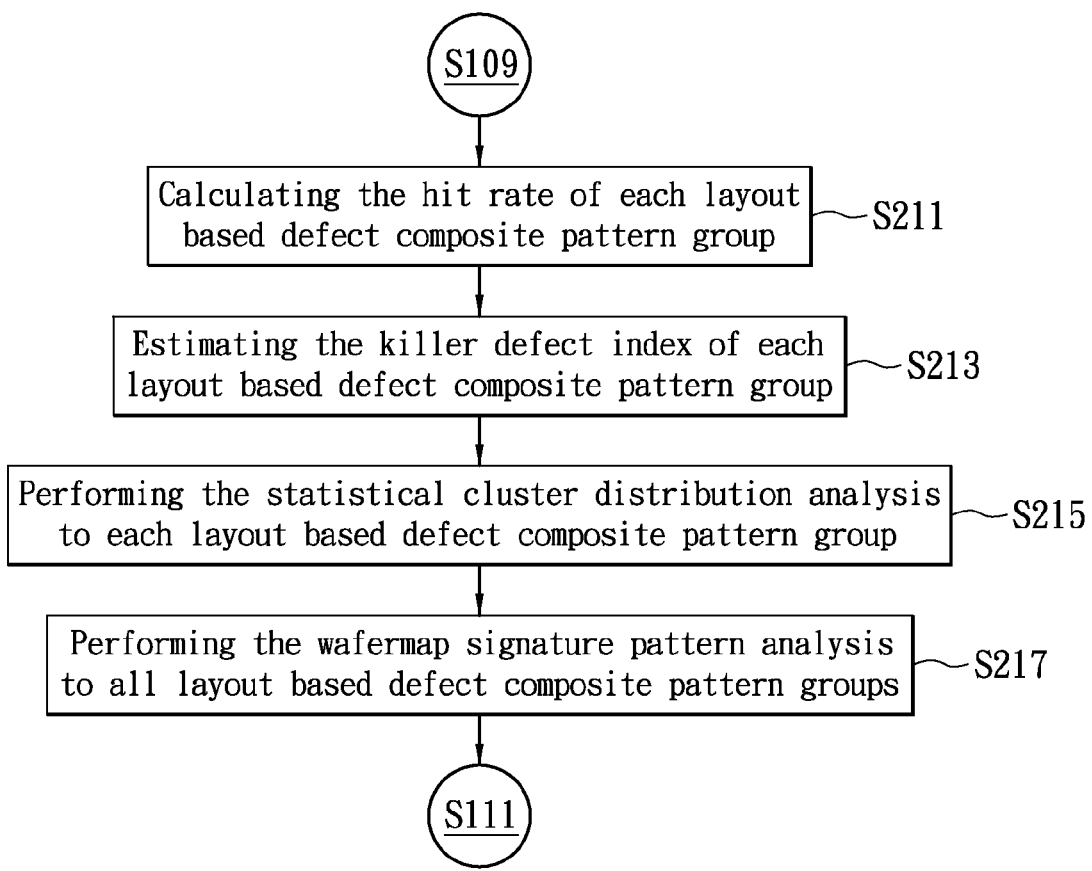
FIG. 2 is a flowchart of the method for smart defect screen and sample in according with a second embodiment of the present invention.

FIG. 2 shows a flowchart of the method for smart defect screen and sample in accordance with a second embodiment of the present invention.

Referring to FIG. 2, the second embodiment is similar to the first embodiment, while the difference between the method for smart defect screen and sample of the second embodiment and the first embodiment is that after constructing a plurality of layout based defect composite pattern groups $LDPG_1$, $LDPG_2$, and $LDPG_3$, etc (S109) in the first embodiment, the second embodiment further comprises following steps.

The computer performing some defect sample selection rules to each layout based defect composite pattern group $LDPG_1$, $LDPG_2$, or $LDPG_3$, etc for judging the potential systematic defect priority. The defect sample selection rules comprise calculating the hit rate of each layout based defect composite pattern group $LDPG_1$, $LDPG_2$, or $LDPG_3$, etc (S211). The hit rate may be associated with the defects count and the cell number of each layout based defect composite pattern group $LDPG_1$, $LDPG_2$, or $LDPG_3$, etc. For example, the hit rate of one layout based defect composite pattern group $LDPG_1$, $LDPG_2$, or $LDPG_3$, etc equals to the defects count over the cell number. If the hit rate of the layout based defect composite pattern group $LDPG_1$, $LDPG_2$, or $LDPG_3$, etc is high, the defect type is probably the systematic defect pattern type.

Defect sample selection rules further comprises estimating the killer defect index of each layout based defect composite pattern group $LDPG_1$, $LDPG_2$, or $LDPG_3$, etc (S213). The killer defect index for each defect is related to the defect size, the defect coordinate offset and the layout pattern critical area. If the defect size is large and the layout pattern width and space is thin, the critical area of the defect in the layout pattern is large. The killer defect index is proportional to the critical area of the defect. The killer defect index represents a failure probability of defect location in the layout pattern, such as short or open.

Defect sample selection rules further comprises performing the statistical cluster distribution analysis to each layout based defect composite pattern group $LDPG_1$, $LDPG_2$, or $LDPG_3$, etc (S215). The computer derive the statistical peak defect coordinates in the defect frequency distribution on each layout based defect composite pattern group $LDPG_1$, $LDPG_2$, or $LDPG_3$, etc.

The peak defect coordinate indicates a frequent occurred defect location providing a better chance to find the systematic defect than the random particle defect.

Defect sample selection rules further comprises performing the wafermap signature pattern analysis to all layout based defect composited pattern groups $LDPG_1$, $LDPG_2$, and $LDPG_3$, etc (S217). The wafermap signature analysis may be accomplished by referring a plurality of defect data from a focus exposure matrix (FEM), or a process window qualification (PWQ) test. When the critical dimension thickness varies in unusual variation wafermap signature pattern in certain die $D_1$, $D_2$, or $D_3$, etc, the systematic defect pattern may be occurred.

The computer may set weight coefficients for each above-mentioned defect sample rule to sort the potential systematic defect priority of each layout based defect composite pattern group $LDPG_1$, $LDPG_2$, or $LDPG_3$, etc.

Besides, the computer may filter the empty field or dummy pattern as the dummy pattern defect for improving the Review SEM capacity and user reviewing efficiency. Further, the computer may analyze the defect as the design weak layout defect type by performing a design check to the design layout 110. The design weak layout defects may be associated with a design rule check violation layout pattern, a lithography/chemical mechanical polishing (CMP) simulation hot spot pattern and existed systematic defect pattern.

The computer may analyze the defect as the abnormal process defect type when the defect area is distributed in some unusual high defect count dice and the shape of the defect area is such as center zone, circular ring, or edge zone, etc.

The computer may analyze the defect as the mask defect type by checking the location of the defects are in some repeated reticle field die locations or a mask repair position according to the mask information and a repair history corresponding to the design layout 110.

The computer may analyze the defect as the random particle defect type when the defect pattern is in different random size, randomly distributed in wafermap, and not in specific layout pattern group except cluster particle defect.

Figure 3:
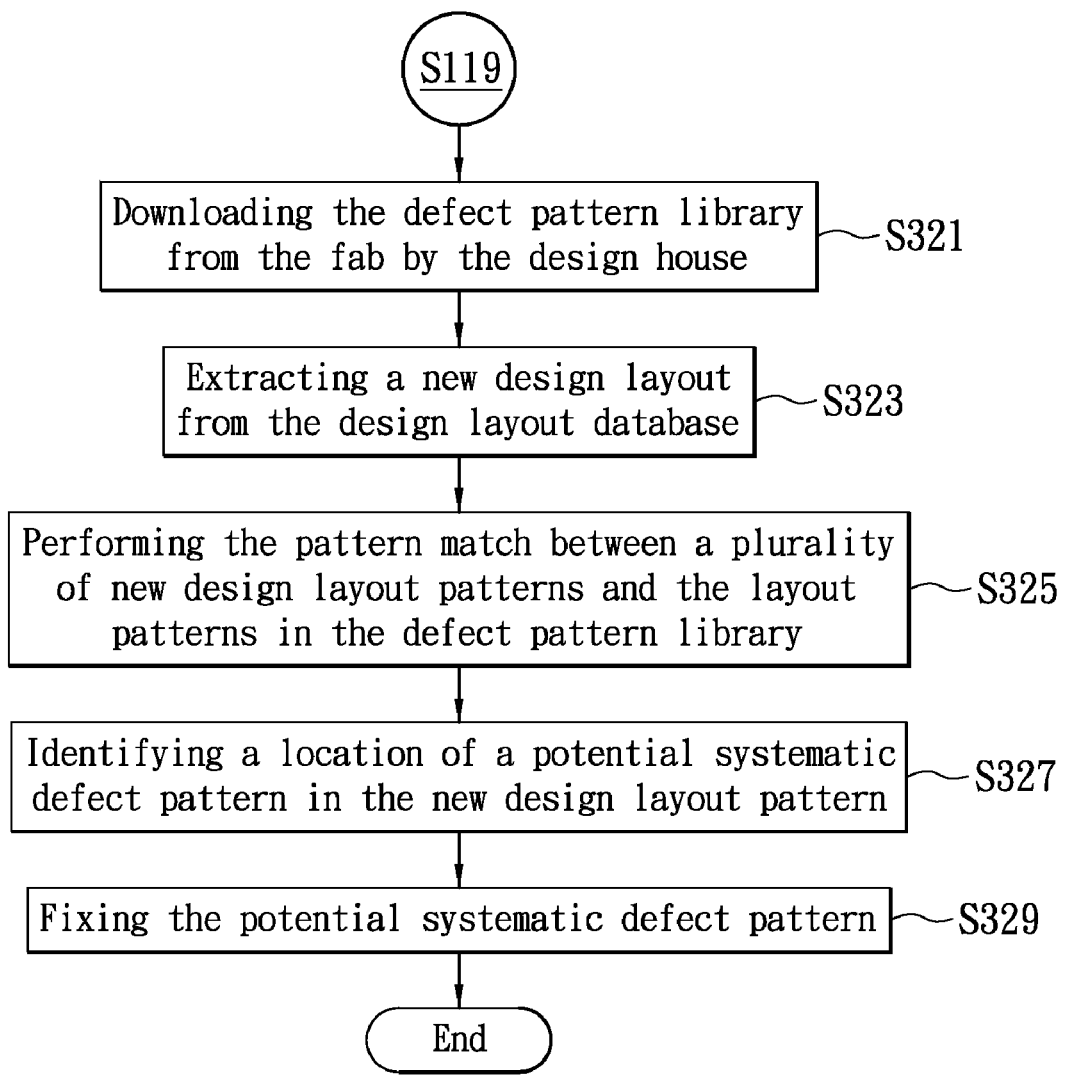
FIG. 3 is a flowchart of the method for smart defect screen and sample in accordance with a third embodiment of the present invention.

FIG. 3 shows a flowchart of the method for smart defect screen and sample in accordance with a third embodiment of the present invention.

Referring to FIG. 3, the third embodiment is similar to the first embodiment, while the difference between the method for smart defect screen and sample of the third embodiment and the first embodiment is that after generating the defect pattern library and the defect yield report by performing defect yield diagnosis to the defect image file (S119), the third embodiment further comprises following steps.

The design house 30 downloads the defect pattern library from the web site of the fab 20 through internet (S321). The designer in the design house 30 extracts a new design layout from the design layout database in the computer (S323). The computer performs the pattern match between a plurality of new design layout patterns and the layout patterns in the defect pattern library (S325).

The computer identifies a location of a potential systematic defect pattern in the new design layout pattern according to the pattern match (S327). The designer could fix the potential systematic defect pattern to avoid the systematic defect in manufacturing (S329).

Figure 4:
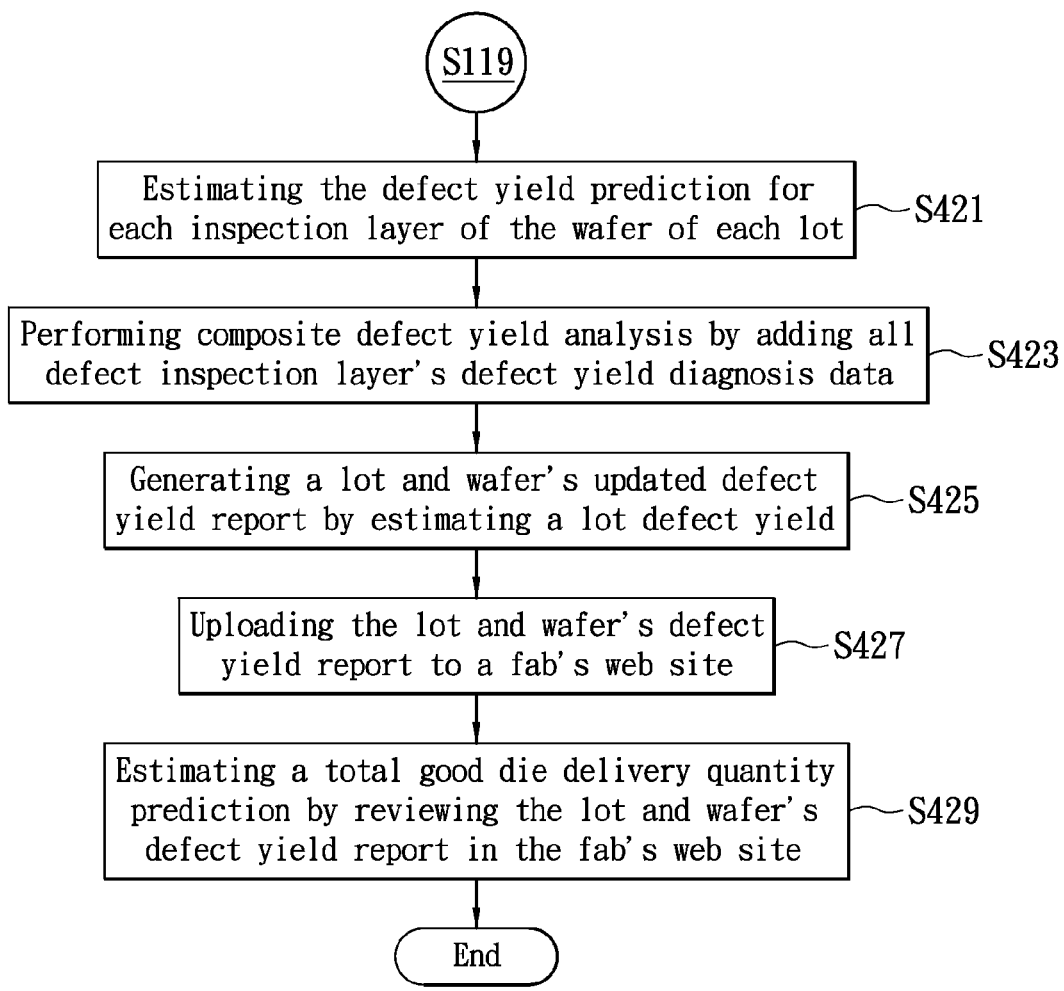
FIG. 4 is a flowchart of the method for smart defect screen and sample in accordance with a fourth embodiment of the present invention.

FIG. 4 shows a flowchart of the method for smart defect screen and sample in accordance with a fourth embodiment of the present invention.

Referring to FIG. 4, the fourth embodiment is similar to the first embodiment, while the difference between the method for smart defect screen and sample of the fourth embodiment and the first embodiment is that after generating the defect pattern library and the defect yield report by performing defect yield diagnosis to the defect image file (S119), the fourth embodiment further comprises following steps.

The fab 20 performs the defect yield prediction for each inspection layer of each wafer of each lot by repeating the smart defect screen and sample method and defect yield diagnosis method (S421). The fab 20 performs a composite defect yield analysis by adding all inspection layer's defect yield diagnosis data for updating the composite defect yield (S423). Then the fab 20 estimates each lot and each wafer's defect yield according to the defect yield prediction and generates the lot and wafer's defect yield report for each wafer of each lot (S425). The fab 20 uploads the lot and wafer's defect yield report to the web site of the fab (S427). The customer or the designer could estimates a total good die delivery quantity prediction by reviewing the lot and wafer's defect yield report from the web site of the fab 20 (S429). Therefore, the customer or the design may know not just current lot health when the lot is going to be shipped, but also how many good die quantity is going to be delivered.

In summary, the method according to the present invention provides the following effects:

1. The fabricated defect failure pattern may be monitored immediately by reviewing the layout based composite defect distribution rather than reviewed in a single defect and single layout pattern.

2. The smart defect sample selection could cover most systematic defects for improving the Review SEM capacity and user review efficiency.

3. Defect yield and future good die quantity estimation are transparent to design house for delivery control.

4. The design layout could be fixed in previous for improving the production yield.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. A method for smart defect screen and sample, executed by a computer, comprising:
    after pre-processing a design layout having a plurality of layout patterns being designed for a wafer with a full-chip layout of a product in a fab, and forming a plurality of layout based pattern groups, in a computer, dividing the design layout into a plurality of cells, wherein each cell belongs to a layout based pattern group according to the layout pattern's feature;
    overlapping the cells belong to the same layout based pattern groups; extracting a plurality of defect data of all defects on a wafer from a defect scan and inspection tool, wherein each defect data comprises a defect size and a defect coordinate;

constructing a plurality of layout based defect composite pattern groups by mapping the defects onto the overlapped layout based pattern groups;

executing layout pattern match to obtain each individual layout based defect composite pattern group if original layout based defect composite pattern group contains more than one defect cluster layout pattern;

performing some defect sample selection rules to each layout based defect composite pattern group for judging a potential systematic defect priority;

sorting the layout based defect composite pattern groups into different defect types according to the potential systematic defect priority; and generating a defect pattern library or a defect yield prediction by performing a defect yield diagnosis to a defect image file obtained by reviewing different sample number of defect image from each layout based defect composite pattern group according to the defect types.

2. The method for smart defect screen and sample as claimed in claim 1, wherein the defect sample selection comprises calculating a hit rate of each layout based defect composite pattern group, wherein the hit rate is associated with the defects count and the cell number of each layout based defect composite pattern group.

3. The method for smart defect screen and sample as claimed in claim 2, wherein the defect sample selection further comprises estimating a killer defect index of each layout based defect composite pattern group, wherein the killer defect index is associated with the defect size, the defect coordinate offset and the layout pattern critical area.

4. The method for smart defect screen and sample as claimed in claim 3, wherein the defect sample selection further comprises performing a statistical cluster distribution analysis to each layout based defect composite pattern group.

5. The method for smart defect screen and sample as claimed in claim 4, wherein the defect sample selection further comprises performing a wafermap signature pattern analysis to whole cell layout patterns in each die.

6. The method for smart defect screen and sample as claimed in claim 4, wherein the defect sample selection further comprises filtering dummy layout pattern defect.

7. The method for smart defect screen and sample as claimed in claim 5, wherein the defect types comprise systematic pattern defect type and nuisance defect type.

8. The method for smart defect screen and sample as claimed in claim 5, wherein the systematic pattern defect type has high hit rate and high killer defect index.

9. The method for smart defect screen and sample as claimed in claim 5, wherein the nuisance defect type has low killer defect index.

10. The computer-implemented method for smart defect screen and sample as claimed in claim 1, further comprises the steps executed in the computer of:

downloading the defect pattern library;

extracting a new design layout from the design layout database;

performing the pattern match between a plurality of new design layout patterns and the layout patterns in the defect pattern library;

identifying a location of a potential systematic defect pattern in the new layout pattern; and fixing the potential systematic defect pattern.

11. The computer-implemented method for smart defect screen and sample as claimed in claim in claim 1, further comprises the steps executed in the computer of:

estimating the defect yield prediction for each layer of the wafer;

performing composite defect yield analysis by adding all the defect inspection layer's defect yield diagnosis data;

generating a lot and wafer's defect yield report according the defect yield prediction;

uploading the lot and wafer's defect yield report a fab's web site; and estimating a total good die delivery quality prediction.

* * * * *